US005705432A

United States Patent [19]
Lee et al.

[11] Patent Number: 5,705,432
[45] Date of Patent: Jan. 6, 1998

[54] PROCESS FOR PROVIDING CLEAN LIFT-OFF OF SPUTTERED THIN FILM LAYERS

[75] Inventors: Kusol Lee, Gardena; Tom Quach; Danny Li, both of Torrance; Liping D. Hou, Rancho Palos Verdes; Sam Chung, Costa Mesa; Tom Y. Chi, San Gabriel, all of Calif.

[73] Assignee: Hughes Aircraft Company, Los Angeles, Calif.

[21] Appl. No.: 566,197

[22] Filed: Dec. 1, 1995

[51] Int. Cl.$^6$ .................................. H01L 21/465
[52] U.S. Cl. ............... 437/228; 437/184; 437/203; 437/944; 430/314; 156/659.11
[58] Field of Search .................. 437/176, 184, 437/203, 231, 239, 228, 944, 981; 148/100; 430/299, 314; 156/659.11

[56] References Cited

U.S. PATENT DOCUMENTS

| | | | |
|---|---|---|---|
| 4,614,564 | 9/1986 | Sheldon et al. | 156/659.11 |
| 4,902,379 | 2/1990 | Rhodes | 437/228 |

FOREIGN PATENT DOCUMENTS

| | | |
|---|---|---|
| 58-091640 | 5/1983 | Japan . |
| 63-204730 | 9/1988 | Japan . |
| 01-013730 | 1/1989 | Japan . |

OTHER PUBLICATIONS

R. Williams, "Modern GaAs Processing Methods", Artech House, 1990, pp. 278–279.

Primary Examiner—John Niebling
Assistant Examiner—Thomas G. Bilodeau
Attorney, Agent, or Firm—M. E. Lachman; M. W. Sales; W. K. Denson-Low

[57] ABSTRACT

A unique photoresist process is provided which achieves clean and complete lift-off of a thin film layer such as a sputtered thin film formed on a photoresist which is formed above a semiconductor substrate. The process of the present invention relies on a reentrant photoresist profile which breaks the continuity of the thin film layer. Accordingly, the process of the present invention ensures a clean lift-off. The desired photoresist profile which breaks the continuity of the thin film layer can be obtained by a typical photoresist process preceded by an oxidation process that takes place on the surface of the semiconductor substrate. The oxidation process provides a thin native oxide layer with thickness ranging from about 30 to 50 Å. No extra processing steps involving dielectric film deposition and etch are required to achieve clean lift-off. Nevertheless, the process of the present invention ensures the clean lift-off of the thin film layer. Accordingly, the process of the present invention provides good visual and electrical yields.

14 Claims, 1 Drawing Sheet

PROCESS FOR PROVIDING CLEAN LIFT-OFF OF SPUTTERED THIN FILM LAYERS

BACKGROUND OF THE INVENTION

1. Field of the Invention

The present invention relates generally to GaAs microwave monolithic integrated circuit (MMIC) fabrication and, more particularly, to the lift-off of sputtered metal film which is used to define metal patterns in GaAs MMICs.

2. Description of Related Art

Sputtered thin films are commonly used in GaAs MMIC fabrication. In particular, sputtered thin film resistors have been extensively used in GaAs MMIC chips for many military and communication systems. Lift-off techniques are commonly employed in GaAs MMIC manufacturing as well as in semiconductor device fabrication, in general. Lift-off techniques are employed to define metal patterns from sputtered metal films. Obtaining a clean lift-off of a thin sputtered film layer such as a sputtered metal film is very important in GaAs MMIC fabrication. By clean lift-off is meant that the edges of the sputtered metal film are not ragged and that the intended metal pattern is formed substantially complete in the sputtered metal film. Incomplete lift-off of the sputtered metal film causes electrical shorts and visual defects. Sputtering techniques used to form sputtered metal films, and other thin sputtered film layers, provide superior conformal deposition characteristics. As such, the attainment of a clean lift-off of sputtered thin film layers has been a long existing challenge in GaAs processing.

At present, there are two approaches employed in obtaining lift-off of sputtered thin film layers: the simple photoresist process and the dielectric assisted lift-off. With the simple photoresist process, a photoresist is deposited on a semiconductor substrate such as GaAs. The photoresist is exposed and developed to define patterns therein. Where the photoresist is exposed and developed, the photoresist is removed down to the underlying semiconductor substrate. After development of the photoresist, photoresist remains only on some regions of the semiconductor substrate. Other regions of the semiconductor substrate thus become exposed. A sputtered metal film is formed on the patterned photoresist and on the regions of the semiconductor substrate that are exposed. The sputtered metal film conforms to the surface of the patterned photoresist. The patterned photoresist is then lifted off. Portions of the sputtered metal film are lifted off as well. Ideally, a patterned metal layer should remain intact on the semiconductor substrate. The patterned metal layer comprises the portions of the sputtered metal film that were formed on the regions of the semiconductor substrate that were exposed.

The simple photoresist process is simple relative to the alternative approach, dielectric assisted lift-off, however, clean lift-off cannot be obtained with the simple photoresist process. Typically, the edges of the patterned metal layer are ragged.

The alternative approach, dielectric assisted lift-off, involves additional steps comprising dielectric deposition and etch. As in the simple photoresist process, photoresist is employed to achieve lift-off. Prior to the deposition of the photoresist, however, a dielectric layer is formed over the semiconductor substrate. The dielectric layer may comprise a 1000 Å layer of oxide or nitride. The photoresist is then deposited on the dielectric layer. As in the simple photoresist process, the photoresist is exposed and developed to define patterns therein. Where the photoresist is exposed and developed, the photoresist is removed down to the underlying dielectric layer. Openings in the photoresist are thereby formed. These openings in the photoresist are defined by the edges of the patterned photoresist. As such, photoresist remains only on some regions of the dielectric layer. Other regions of the dielectric layer are exposed.

The dielectric layer is then etched using an additional etching process to extend the patterns into the dielectric layer. Where the dielectric layer is exposed, the dielectric layer is etched down to the semiconductor substrate. Openings in the dielectric layer are thereby formed. These openings in the dielectric layer have sidewalls. The additional etching process, i.e., the dielectric etch, also attacks the sidewalls in the openings in the dielectric layer. Thus, dielectric from beneath the photoresist, i.e., the unexposed photoresist, is removed. The dielectric layer at the sidewalls is etched to form a reentrant profile in the dielectric layer that is formed beneath the edge of the patterned photoresist. The term "reentrant" is used herein in its accepted meaning of "directed inward".

Upon completion of the additional etching process, i.e., the dielectric etch, photoresist and dielectric remain on only some regions of the semiconductor substrate. Other regions of the semiconductor substrate are exposed. As above, a sputtered metal film is formed on the patterned photoresist and on the regions of the semiconductor substrate that are exposed. Again, the sputtered metal film conforms to the surface of the photoresist. The photoresist is lifted off. Portions of the sputtered metal film are lifted off as well. After the lift-off step, the patterned metal layer should remain intact on the semiconductor substrate. The patterned metal layer comprises the portions of the sputtered metal film that were formed on the regions of the semiconductor substrate that were exposed. The dielectric layer is not lifted off along with the photoresist. As such, the dielectric layer also should remain intact on the semiconductor substrate. The patterned metal layer is surrounded by this dielectric layer.

The dielectric assisted lift-off is effective in obtaining clean lift-off; however, as described above, an additional dielectric deposition and etch is required. For additional details regarding the dielectric assisted lift-off process see, e.g., R. Williams, "Modern GaAs Processing Methods", Artech House, 1990, pp. 278–279.

Thus, there remains a need for a simple photoresist process for obtaining clean lift-off of thin films deposited using sputtering deposition techniques.

SUMMARY OF THE INVENTION

In accordance with the present invention, a process for achieving clean and substantially complete lift-off of a thin film layer is provided. The thin film layer is formed over a photoresist which is formed above a semiconductor substrate having a surface. The process comprises the steps of:

(a) forming a thin native oxide layer on the surface of the semiconductor substrate;

(b) coating the semiconductor substrate having the thin native oxide layer formed thereon with the photoresist;

(c) baking the photoresist;

(d) exposing the photoresist to provide a latent pattern in the photoresist;

(e) developing the photoresist to form a pattern therein using a developer which etches both the photoresist which has been exposed and the thin native oxide layer thereby forming at least one opening in the photoresist and the thin native oxide layer having sides and thereby creating at least one exposed portion of the semiconductor substrate, the developer also removing the thin native oxide layer from beneath the photoresist on the sides of the opening that has not been exposed and undercutting the photoresist on the sides of the opening that has not been exposed thereby forming a reentrant angle in the profile of the photoresist and providing a patterned photoresist;

(f) depositing a thin film layer on the patterned photoresist and on the exposed portions of the semiconductor substrate; and (g) lifting-off the photoresist and the thin film layer, thereby forming a patterned thin film layer.

The process of the present invention enables very clean lift-off of thin film layers deposited using sputtering deposition techniques to be achieved. The major advantage of the present invention is that the process for attaining clean lift-off is simplified. No extra processing steps for dielectric deposition and etching are required. A very thin native oxide layer (about 40 Å) is provided on the surface of the GaAs substrate and a reentrant photoresist profile is created in the photoresist. This reentrant photoresist profile breaks the continuity of the thin film layer. This unique photoresist profile of the present invention ensures the clean lift-off of the thin film layer. Accordingly, good visual and electrical yields are provided. In particular, the yields of MMICs are improved.

DESCRIPTION OF THE PREFERRED EMBODIMENTS

Reference is now made in detail to a specific embodiment of the present invention, which illustrates the best mode presently contemplated by the inventors for practicing the invention. Alternative embodiments are also briefly described as applicable.

The present invention is directed to a process involving the formation of a unique photoresist profile to ensure the clean lift-off of a sputtered thin film formed thereon.

Figure 1:
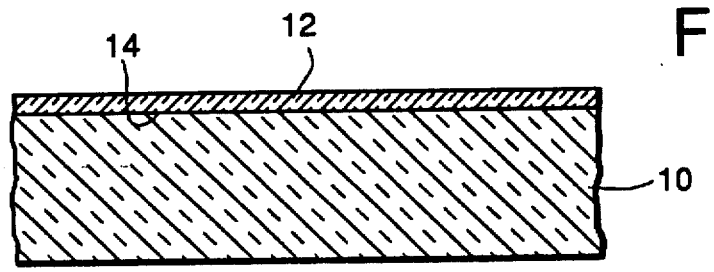
FIG. 1 is a cross-sectional view depicting the GaAs substrate having formed thereon the thin native oxide layer.

The process procedure of the invention now follows:

Referring now to FIG. 1, wherein like reference numerals designate like elements throughout, a GaAs substrate 10, (semiconductor substrate) is depicted having a thin native oxide layer 12 formed thereon. Other suitable semiconductor substrates 10 may also be employed in the practice of the present invention. The semiconductor substrate 10 may comprise, for example, other III–V semiconductor materials. Examples of III–V semiconductor materials suitably employed as the semiconductor substrate included InP, InSb, and AlAs.

The thin native oxide layer 12 comprises thin native oxide which is easily grown on the surface 14 of the GaAs substrate 10. The typical thickness of the thin native oxide is about 40 Å. The thin native oxide layer 12 is formed on the GaAs substrate 10 by exposing the surface 14 of the GaAs substrate to an oxygen plasma. Alternatively, baking the GaAs substrate 10 in air at a temperature ranging between about 100° to 150° C. will also result in the formation of the thin native oxide layer 12. The native oxide is formed by an oxidation process which takes place on the surface 14 of the GaAs substrate 10. Either form of surface preparation, i.e., exposing the surface 14 of the GaAs substrate 10 to oxygen plasma or baking the GaAs substrate, can be employed. For either form of surface preparation, the growth of the thin native oxide layer 12 is self-limiting. The resulting thickness of the thin native oxide layer 12 is in the range of about 30 to 50 Å.

Figure 2:
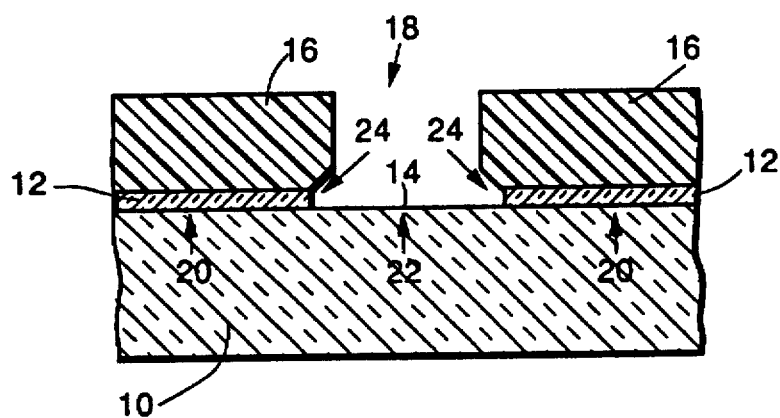
FIG. 2 is a cross-sectional view depicting the photoresist profile after the developing process.

After completing the surface preparation described above, the GaAs substrate 10, with the thin native oxide layer 12 formed thereon, is coated with a photoresist 16. The photoresist 16 is formed using conventional photoresist coating techniques and comprises any of the known photoresists. The photoresist 16 is baked and exposed to provide a latent pattern therein. Conventional bake and expose processes are employed to bake and expose the photoresist 16. The photoresist 16 is subsequently developed to form a pattern therein, as shown in FIG. 2.

The development of the photoresist 16 is an important feature of the present invention. For a positive photoresist, the exposed photoresist is developed out while the unexposed photoresist is not developed out as fast; the ratio of the two rates being about 15:1. The developer, which comprises any of the known developers for the particular photoresist employed, attacks and etches both the photoresist 16, i.e., the exposed photoresist, and the thin native oxide layer 12 that lies underneath the exposed photoresist. During development of the photoresist 16, the developer first removes the exposed photoresist. Where the photoresist 16 is exposed and developed, the photoresist is removed down to the underlying thin native oxide layer 12. An opening 18 is thereby formed in the photoresist 16. This opening 18 in the photoresist 16 has sidewalls or sides. While one such opening 18 is shown formed in the photoresist 16, it will be readily apparent to those skilled in this art that, in fact, other openings may be formed in the photoresist as well.

The developer also attacks and etches the thin native oxide layer 12. The thin native oxide layer 12 is removed down to the surface 14 of the GaAs substrate 10. Accordingly, the opening 18 is extended down into the thin native oxide layer 12 as shown in FIG. 2. The opening 18 in the thin native oxide layer 12 also has sidewalls or sides. The thin native oxide layer 12 and the photoresist 16 remain on the regions of the GaAs substrate 10 indicated by arrows 20. In contrast, the region of the GaAs substrate 10 indicated by arrow 22 is exposed.

The developer also attacks the sidewalls or sides of the opening 18 in the photoresist 16 and the thin native oxide layer 12. In particular, the developer attacks the sidewalls or sides of the opening 18 in the photoresist 16 and the thin native oxide layer 12 at positions indicated by arrows 24 in FIG. 2. The developer causes the thin native oxide layer 12 to be removed from beneath the photoresist 16 at positions indicated by arrows 24. Accordingly, the thin native oxide layer 12 is removed from beneath the photoresist 16 that has not been exposed, i.e., unexposed photoresist. Once the thin native oxide layer 12 is removed from beneath the unexposed photoresist 16, the developer undercuts the unexposed photoresist at the positions indicated by arrows 24. The developer attacks the unexposed photoresist 16 from two directions, namely, from underneath and from the side. In this manner, a reentrant angle in the photoresist profile is created at the positions indicated by arrows 24. The height and width of the reentrant photoresist profile is a function of developing time. As described above, the term "reentrant" is used herein in its accepted meaning of "directed inward".

The photoresist profile after the developing process is shown in FIG. 2. While the photoresist profile of one such region above the GaAs substrate 10 is shown, it will be readily apparent to those skilled in this art that, in fact, patterns in the photoresist 16 having similar photoresist profiles are formed over other portions of the GaAs substrate as well.

Figure 3:
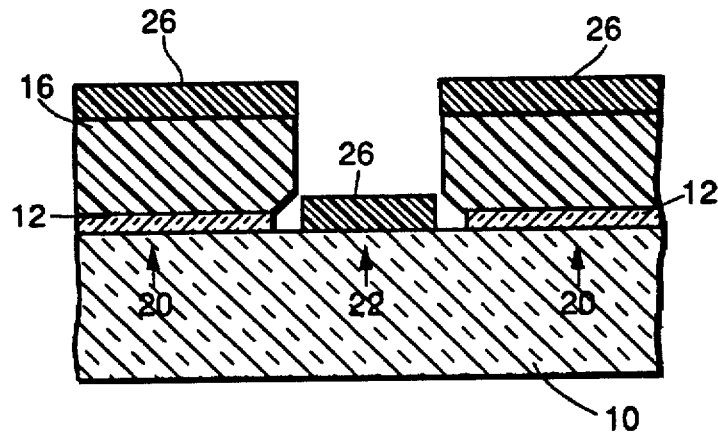
FIG. 3 is a cross-sectional view depicting the thin film layer having a discontinuity caused by the reentrant photoresist profile.

Next, a thin film layer 26, as shown in FIG. 3, is deposited by employing conventional sputtering techniques. It will be readily apparent to those skilled in this art that, the thin film layer 26 may alternatively be deposited by employing conventional evaporation techniques. The thin film layer 26 is formed on the photoresist 16 and on the exposed portion of the GaAs substrate 10, i.e., above the region indicated by arrow 22 in FIG. 3. The thin film layer 26 may comprise metal such as TaN (tantalum nitride). The thin film layer 26 may comprise other metals and non-metals as well. Examples of other metals suitably employed as the thin film layer 26 include NiCr (nickel chromium), TiW (titanium tungsten), and Ta (tantalum). The thickness of the thin film layer 26 ranges from about 500 to 1000 Å. The thin film layer 26 has a discontinuity caused by the reentrant photoresist profile which is depicted in FIG. 3. The reentrant photoresist profile interrupts the continuity of the thin film layer 26 during deposition thereof. Accordingly, a discontinuity in the thin film layer 26 is created.

Figure 4:
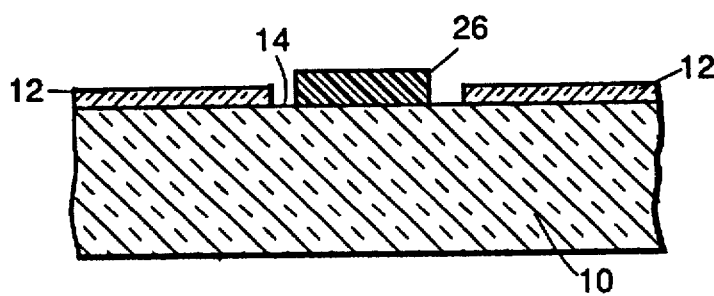
FIG. 4 is a cross-sectional view depicting the patterned thin film layer after achieving clean lift-off.

The GaAs wafer is then soaked in acetone. Both the thin film layer 26 and the photoresist 16 are cleanly lifted off. The presence of the discontinuity in the thin film layer 26 ensures that the thin film layer 26 is cleanly lifted off. FIG. 4 depicts the thin film layer 26 patterned and intact on the semiconductor substrate 10. The thin native oxide layer 12 also remains on portions of the surface 14 of the GaAs substrate 10. The thin native oxide layer 12 is not lifted off during the thin film layer lift-off process. Also shown in FIG. 4 are the remaining portions of the native oxide layer 12 which surround the patterned thin film layer 26.

The process of the present invention relies on the reentrant photoresist profile which breaks the continuity of the thin film layer 26. The desired reentrant photoresist profile which breaks the continuity of the thin film layer 26 can be obtained by typical photoresist processes preceded by the oxidation process that takes place on the surface 14 of the GaAs substrate 10. The desired reentrant photoresist profile of the present invention ensures the clean lift-off of the thin film layer 26 such that the edges or sides of the openings in the thin film layer 26 are smooth. Accordingly, good visual and electrical yields are provided. In particular, the yields of MMICs are improved.

The major advantage of the present invention is that no extra dielectric film deposition and etch processing steps are required to achieve clean lift-off. Nevertheless, a unique photoresist profile is provided.

EXAMPLES

GaAs MMIC chips were fabricated using the process of the invention and were examined.

Specifically, several GaAs wafers were fabricated in accordance with the process of the invention. A thin native oxide layer 12 was formed on the surface 14 of several of the GaAs substrates 10 or GaAs wafers. The GaAs substrates 10 having the thin native oxide layer 12 formed thereon were coated with a photoresist 16. The photoresist 16 was BPRS-100, a positive photoresist available from OGC Microelectronics Material Inc. (West Paterson, N.J.). The photoresist 16 was baked, exposed and developed to form a pattern therein. The developer employed was PLSI, a positive resist developer available from OGC Microelectronics Material Inc. A patterned photoresist 16 as well as posed portions on the GaAs substrates 10 were thereby provided. A reentrant angle in the profile was thus formed in the photoresist 16. A thin film layer 26 comprising a TaN film was deposited on the patterned photoresist 16 and on the exposed portions of the GaAs substrates 10. The TaN film, having a thickness of about 500 Å, was sputtered on these GaAs wafers 10. The photoresist 16 and the TaN film were lifted-off. A patterned TaN film was thereby formed.

Several of the GaAs wafers 10 were fabricated without a thin native oxide layer 12 to serve as a control group. Also evaluated were several GaAs wafers 10 using four different photoresist developing times. A summary of these results is listed in Table 1.

TABLE I

SUMMARY OF RESULTS FOR GaAs WAFERS FABRICATED USING DIFFERENT PHOTORESIST DEVELOPING TIMES

| Developing Time | Lift-off |
| --- | --- |
| 120 seconds | 10% residue |
| 150 seconds | 5% reside |
| 180 seconds | completely clean |
| 240 seconds | completely clean |

The results of the examination confirm the functions and advantages expected of the present invention, namely, that a clean lift-off is provided. As described above, by clean lift-off is meant that the edges of the thin film layer 26 are not ragged and that the intended pattern is formed substantially complete in the thin film layer. Without the thin native oxide layer 12, the lift-off was not clean and complete. With the thin native oxide layer 12, if the developing time was not long enough, the lift-off was not completely clean. The lift-off was not completely clean when the developing time was not long enough due to the fact that the reentrant angle was not wide enough to break the continuity of the thin film layer 26 of TaN sputtered on the GaAs substrate 10.

Thus, there has been disclosed a unique photoresist process which ensures the clean lift-off of sputtered thin films. The process of the invention for clean lift-off of sputtered thin films can be applied to GaAs MMIC fabrication and, in particular, to all MMIC chips utilizing sputtered thin film resistors. It will be readily apparent to those skilled in this art that various changes and modifications of an obvious nature may be made, and all such changes and modifications are considered to fall within the scope of the invention, as defined by the appended claims.

What is claimed is:

1. A process for achieving clean and substantially complete lift-off of a thin film layer formed over a photoresist which is formed above a semiconductor substrate having a surface, said process comprising the steps of:

(a) forming a thin native oxide layer on said surface of said semiconductor substrate;

(b) coating said semiconductor substrate having said thin native oxide layer formed thereon with said photoresist;

(c) baking said photoresist;

(d) exposing said photoresist to provide a latent pattern in said photoresist;

(e) developing said photoresist to form a pattern therein using a developer which etches both said photoresist which has been exposed and said thin native oxide layer thereby forming at least one opening in said photoresist and said thin native oxide layer having sides and thereby creating at least one exposed portion of said semiconductor substrate, said developer also removing said thin native oxide layer from beneath said photoresist on said sides of said opening that has not been exposed and undercutting said photoresist on said sides of said opening that has not been exposed thereby forming a reentrant angle in the profile of said photoresist and providing a patterned photoresist;

(f) depositing a thin film layer on said patterned photoresist and on said exposed portions of said semiconductor substrate; and (g) lifting-off said photoresist and said thin film layer, thereby forming a pattern in said thin film layer wherein openings in said pattern have smooth sides.

2. The process of claim 1 wherein said developer etches said photoresist on said sides of said opening that has not been exposed, from underneath said photoresist and from said sides of said photoresist.

3. The process of claim 1 wherein a single developer is employed which etches both said photoresist which has been exposed and said thin native oxide layer.

4. The process of claim 1 wherein said reentrant angle interrupts the continuity of said thin film layer.

5. The process of claim 1 wherein said thin native oxide layer remains on said surface of said semiconductor substrate after lifting-off said photoresist.

6. The process of claim 1 wherein said semiconductor substrate comprises III–V semiconductor materials.

7. The process of claim 6 wherein said semiconductor substrate is selected from the group of III–V semiconductor materials consisting of GaAs, InP, InSb, and AlAs.

8. The process of claim 1 wherein said thin native oxide layer is formed by a process comprising either exposing said surface of said semiconductor substrate to oxygen plasma or baking said semiconductor substrate at a temperature within the range of about 100° to 150° C.

9. The process of claim 1 wherein said thin native oxide layer has a thickness within the range of about 30 to 50 Å.

10. The process of claim 1 wherein said thin film layer ranges from about 500 to 1000 Å thick.

11. The process of claim 1 wherein said thin film layer is deposited using a technique selected from the group consisting of sputtering techniques and evaporation techniques.

12. The process of claim 1 wherein said thin film layer consists essentially of a metal.

13. The process of claim 12 wherein said metal is selected from the group consisting of TaN, NiCr, TiW, and Ta.

14. The process of claim 1 wherein lifting-off said photoresist is achieved by soaking in acetone said semiconductor substrate having formed thereon said thin native oxide layer, said photoresist, and said thin film layer.

* * * * *